US009082977B1

United States Patent
Hashimoto et al.

(10) Patent No.: US 9,082,977 B1
(45) Date of Patent: Jul. 14, 2015

(54) PIEZOELECTRIC FILM AND USAGE THEREOF

(71) Applicant: Panasonic Corporation, Osaka (JP)

(72) Inventors: Kazuya Hashimoto, Osaka (JP); Yoshiaki Tanaka, Nara (JP); Takakiyo Harigai, Osaka (JP); Hideaki Adachi, Osaka (JP); Eiji Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/316,803

(22) Filed: Jun. 27, 2014

(30) Foreign Application Priority Data

Feb. 26, 2014 (JP) .................................. 2014-034995

(51) Int. Cl.
  *B41J 2/045* (2006.01)
  *H01L 41/187* (2006.01)
  *B41J 2/14* (2006.01)
  *H02N 2/18* (2006.01)
  *G01C 19/56* (2012.01)
  *G01C 19/5776* (2012.01)

(52) U.S. Cl.
  CPC ........... *H01L 41/1871* (2013.01); *B41J 2/1433* (2013.01); *B41J 2/14201* (2013.01); *G01C 19/56* (2013.01); *G01C 19/5776* (2013.01); *H01L 41/1878* (2013.01); *H02N 2/186* (2013.01)

(58) Field of Classification Search
  CPC .. B41J 2/1401; B41J 2/14233; B41J 2/14274; B41J 2/1607; B41J 2/1612
  USPC ................................................. 347/68, 70–72
  See application file for complete search history.

(56) References Cited

U.S. PATENT DOCUMENTS

| | | | |
|---|---|---|---|
| 6,638,894 B1 * | 10/2003 | Batlogg et al. ................ | 505/126 |
| 7,235,917 B2 * | 6/2007 | Fukui et al. ................... | 310/364 |
| 7,870,787 B2 | 1/2011 | Harigai et al. | |

(Continued)

FOREIGN PATENT DOCUMENTS

| | | |
|---|---|---|
| CN | 101981718 | 6/2013 |
| WO | 2010/047049 | 4/2010 |
| WO | 2013/114794 | 8/2013 |

OTHER PUBLICATIONS

Ye-Jing Dai et al. "Piezoelectric and Ferroelectric Properties of Li-Doped (Bi0.5Na0.5)TiO3—(Bi0.5K0.5)TiO3—BaTiO3 Lead-Free Piezoelectric Ceramics" Journal of the American Ceramic Society, vol. 93 [4], 2010, pp. 1108-1113.

*Primary Examiner* — Juanita D Jackson
(74) *Attorney, Agent, or Firm* — McDermott Will & Emery LLP

(57) ABSTRACT

The present invention provides a piezoelectric film having a higher polarization-disappearance temperature Td and the usage thereof. The piezoelectric film of the present invention comprising an interface layer of $(Na_{x1}, Bi_{y1})TiO_{0.5x1+1.5y1+2}$-$BaTiO_3$ layer having a (001) orientation only and a piezoelectric layer of a $(Na_{x2}, Bi_{y2})TiO_{0.5x2+1.5y2+2}$-$BaTiO_3$ layer having a (001) orientation only, where x1 is 0.28-0.43, y1 is 0.49-0.60, x2 is 0.30-0.46, and y2 is 0.51-0.63. The piezoelectric layer is formed on the interface layer. The interface layer contains nickel. The interface layer has a Ni/Ti molar ratio of not less than 0.02.

15 Claims, 12 Drawing Sheets

(56) References Cited

U.S. PATENT DOCUMENTS 7,985,348 B2 * 7/2011 Tsukada et al. .......... 252/62.9 R 2011/0143146 A1 * 6/2011 Harigai et al. .................. 347/70
2013/0328974 A1   12/2013 Tanaka et al.

* cited by examiner

PIEZOELECTRIC FILM AND USAGE THEREOF

BACKGROUND

1. Field of the Invention

The present invention relates to a piezoelectric film and the usage thereof.

2. Description of the Related Art

A perovskite composite oxide $[(Na, Bi)_{1-x}Ba_x]TiO_3$ (hereinafter, referred to as "NBT-BT") has been recently researched and developed as a non-lead (lead-free) ferroelectric material.

US Pre-Grant Patent Application Publication No. 2013/0328974A1 discloses an NBT-BT film having a high polarization-disappearance temperature Td. In particular, US Pre-Grant Patent Application Publication No 2013/0328974A1 discloses that a $(1-\alpha)(Na, Bi, Ba)TiO_3-\alpha BiQO_3$ (Q=Fe, Co, $Zn_{0.5}Ti_{0.5}$, or $Mg_{0.5}Ti_{0.5}$) layer formed on an $Na_xLa_{1-x+y}Ni_{1-y}O_{3-x}$ layer by RF magnetron sputtering under a temperature of 650 degrees Celsius has a polarization-disappearance temperature Td of approximately 180 degrees Celsius-250 degrees Celsius. The $(1-\alpha)(Na, Bi, Ba)TiO_3-\alpha BiQO_3$ layer has a (001) orientation only. The $Na_xLa_{1-x+y}Ni_{1-y}O_{3-x}$ layer is formed on a Pt film having a (111) orientation by an RF magnetron sputtering under a temperature of 300 degrees Celsius.

Journal of the American Ceramic Society 93 [4] (2010) 1108-1113 discloses a method for measuring a polarization-disappearance temperature Td.

SUMMARY

The piezoelectric film of the present invention comprises:

a $(Na_{x1}, Bi_{y1})TiO_{0.5x1+1.5y1+2}$-$BaTiO_3$ layer having a (001) orientation only, and a $(Na_{x2}, Bi_{y2})TiO_{0.5x2+1.5y2+2}$-$BaTiO_3$ layer having a (001) orientation only, wherein the $(Na_{x2}, Bi_{y2})TiO_{0.5x2+1.5y2+2}$-$BaTiO_3$ layer is formed on the $(Na_{x1}, Bi_{y1})TiO_{0.5x1+1.5y1+2}$-$BaTiO_3$ layer, the $(Na_{x1}, Bi_{y1})TiO_{0.5x1+1.5y1+2}$-$BaTiO_3$ layer contains nickel, the $(Na_{x1}, Bi_{y1})TiO_{0.5x1+1.5y1+2}$-$BaTiO_3$ layer has a Ni/Ti molar ratio of not less than 0.02, and all of the following four mathematical formulae (I)-(IV) are satisfied.

$$0.28 \le x1 \le 0.43 \quad (I)$$

$$0.49 \le y1 \le 0.60 \quad (II)$$

$$0.30 \le x2 \le 0.46 \quad (III)$$

$$0.51 \le y2 \le 0.63 \quad (IV)$$

The spirits of the present invention include an ink jet head, an angular velocity sensor, and a piezoelectric generating element each comprising the piezoelectric film.

The spirits of the present invention also includes a method for forming an image using the ink jet head, a method for measuring an angular velocity using the angular velocity sensor, and a method for generating an electric power using the piezoelectric generating element.

The present invention provides a piezoelectric film having a higher polarization-disappearance temperature Td and the usage thereof.

DETAILED DESCRIPTION OF THE EMBODIMENTS

The embodiment of the present invention will be described below with reference to the drawings.

(Definition of Terms)

The terms used in the instant specification are defined as below.

The term "linearity" means a linearity between an applied electric field and an amount of displacement. It is desirable that the linearity is high. The phrase "linearity is high" means that the amount of displacement is proportional to the applied electric field.

The term "applied electric field" means an electric field applied to a piezoelectric layer.

The term "amount of displacement" means the displacement amount of the piezoelectric layer generated by the applied electric field.

The relationship between the amount of displacement and the applied electric field is described below.

For the angular velocity sensor capable of measuring an exact angular velocity, for the ink jet head capable of ejecting an exact amount of an ink, and for the piezoelectric power generation element capable of generating an electric power due to positive piezoelectric effect, the amount of the displacement is required to be proportional to the electric field. In other words, the amount b of the displacement and the electric field a are required to satisfy the following equation (1).

$$b = c_1 a \ (c_1 \text{ is a constant}) \quad \text{Equation (1)}$$

The term "proportional" in the present specification means that the values of a and b satisfy the above-mentioned equation (1). In other words, the term "proportional" means a linear function. The term "proportional" does not include a quadratic function.

Figure 4A:
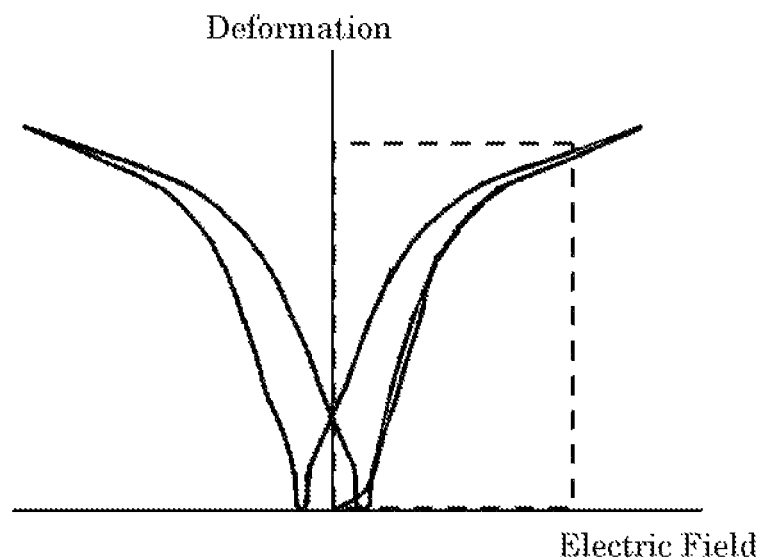
FIG. 4A shows a graph of electric field—amount of displacement properties of a conventional piezoelectric material.
Figure 4B:
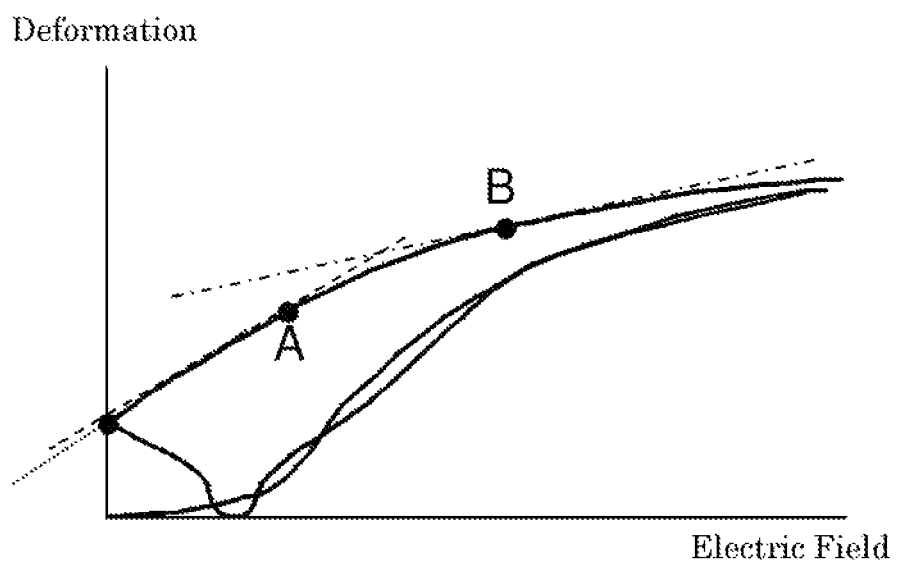
FIG. 4B shows a partially enlarged view of FIG. 4A.

FIG. 4A shows a graph of electric field—amount of displacement properties of a conventional piezoelectric material. FIG. 4B shows a partially enlarged view of FIG. 4A.

As shown in FIG. 4B, the inclination of the tangent line at the dot A is substantially equal to the inclination of the tangent line at the dot B. The phrase "substantially equal" means that the ratio represented by the formula: (the inclination of the tangent line at the dot A)/(the inclination of the tangent line at the dot B) is not less than 0.8 and not more than 1.2. This means that the amount b of the displacement is proportional to the electric field a. The applied electric fields at the dot A and at the dot B are, for example, 0.3 volts/micrometer and 1.8 volts/micrometer, respectively.

When the amount b of the displacement and the electric field a have a relationship of a non-linear function, it is difficult to measure an exact angular velocity, to eject an exact amount of an ink, and to generate an electric power due to a positive piezoelectric effect. The relationship of the non-linear function between the amount b of the displacement and the electric filed a is not suitable for the angular velocity sensor capable of measuring an exact angular velocity, for the ink jet head capable of ejecting an exact amount of an ink, and for the piezoelectric power generation element capable of generating an electric power due to a positive piezoelectric effect.

The term "polarization-disappearance temperature Td" means the temperature when a polarization included in the piezoelectric layer disappears completely by heating the piezoelectric layer. In other words, the piezoelectric layer completely loses its polarization at a temperature more than the polarization-disappearance temperature Td. The piezoelectric layer which does not have the polarization fails to serve as a piezoelectric layer. In view of the solder reflow, it is desirable that the polarization-disappearance temperature Td is not less than 180 degrees Celsius. It is more desirable that the polarization-disappearance temperature Td is not less than 300 degrees Celsius. It is further more desirable that the polarization-disappearance temperature Td is not less than 370 degrees Celsius.

(Piezoelectric Film)

Figure 1A:
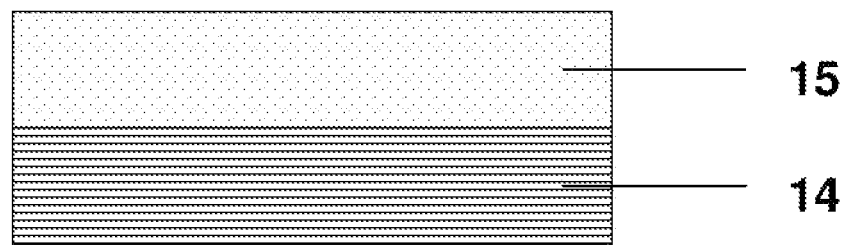
FIG. 1A shows a cross-sectional view of a piezoelectric film according to the present embodiment.

FIG. 1A shows a cross-sectional view of a piezoelectric film according to the present embodiment. As shown in FIG. 1A, the piezoelectric film 1a according to the present embodiment comprises a $(Na_{x1}, Bi_{y1})TiO_{0.5x1+1.5y1+2}$-$BaTiO_3$ layer 14 and a $(Na_{x2}, Bi_{y2})TiO_{0.5x2+1.5y2+2}$-$BaTiO_3$ layer 15.

For a simple description, hereinafter, the $(Na_{x1}, Bi_{y1})TiO_{0.5x1+1.5y1+2}$-$BaTiO_3$ layer 14 is referred to as an "interface layer". The $(Na_{x2}, Bi_{y2})TiO_{0.5x2+1.5y2+2}$-$BaTiO_3$ layer 15 is referred to as a "piezoelectric layer". Therefore, the piezoelectric film according to the present embodiment comprises the interface layer 14 and the piezoelectric layer 15.

Figure 1B:
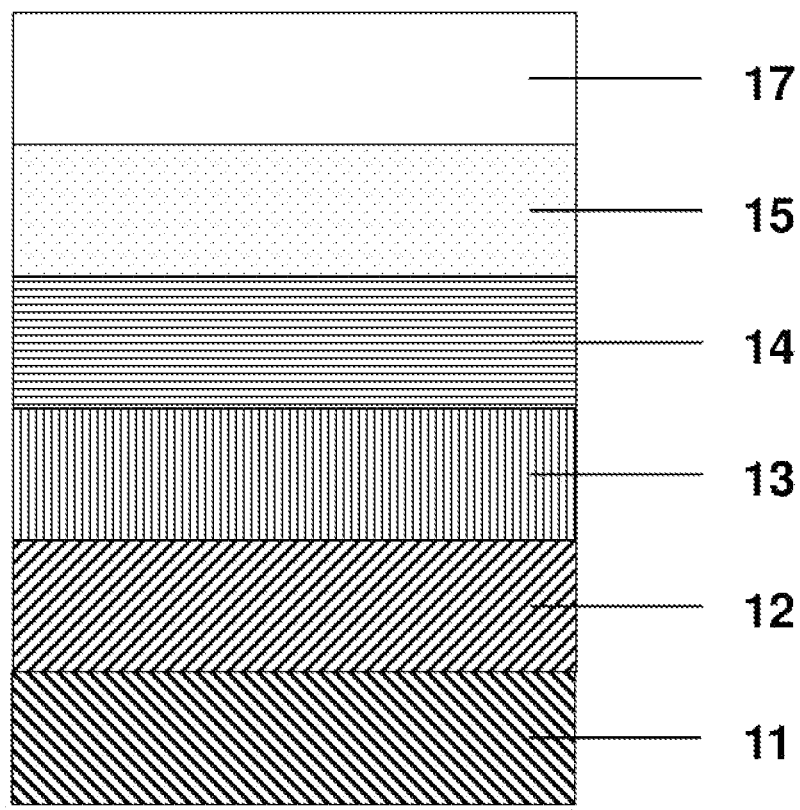
FIG. 1B shows a cross-sectional view of a desirable piezoelectric film according to the present embodiment.

FIG. 1B shows a cross-sectional view of a desirable piezoelectric film according to the present embodiment. The piezoelectric film 1a according to the present embodiment comprises a substrate 11, a metal electrode layer 12, a $LaNiO_3$ layer 13, the interface layer 14, the piezoelectric layer 15, and a conductive layer 17, as shown in FIG. 1B.

The piezoelectric layer 15 is formed on the interface layer 14. Desirably, the piezoelectric layer 15 is in contact with the interface layer 14. In other words, it is desirable that the piezoelectric layer 15 is physically in contact with the interface layer 14.

The piezoelectric layer 15 has a (001) orientation only. In other words, the piezoelectric layer 15 according to the present embodiment does not substantially have an orientation other than a (001) orientation, such as a (100) orientation, a (010) orientation, a (110) orientation, or a (111) orientation. As such the piezoelectric layer 15 has an intense (001) orientation.

The interface layer 14 also has a (001) orientation only. Desirably, the interface layer 14 is formed on the $LaNiO_3$ layer 13. The reason will be explained in the description of a fabrication method for the piezoelectric film according to the present embodiment.

The interface layer 14 contains nickel in such a manner that the interface layer 14 has a Ni/Ti molar ratio of not less than 0.02. A Ni/Ti molar ratio less than 0.02 decreases the polarization disappearance temperature Td significantly. See the comparative example 9, which is described later. It is desirable that the Ni/Ti molar ratio is not more than 0.05. A Ni/Ti molar ratio more than 0.05 may decreases the piezoelectric constant d31 and the linearity. See the example 15.

In the piezoelectric film according to the present embodiment, all of the folio four mathematical formulae (I)-(IV) are satisfied.

$$0.28 \leq x1 \leq 0.43 \quad \text{(I)}$$

$$0.49 \leq y1 \leq 0.60 \quad \text{(II)}$$

$$0.30 \leq x2 \leq 0.46 \quad \text{(III)}$$

$$0.51 \leq y2 \leq 0.63 \quad \text{(IV)}$$

The value of x1 included in the mathematical formula (I) represents a sodium composition ratio in the interface layer 14. In case where the value of x1 is less than 0.28, the polarization-disappearance temperature Td is decreased significantly. See the comparative example 1. In case where the value of x1 is more than 0.43, the polarization-disappearance temperature Td is decreased significantly. See the comparative example 2.

The value of y1 included in the mathematical formula (II) represents a bismuth composition ratio in the interface layer 14. In case where the value of y1 is less than 0.49, the polarization-disappearance temperature Td is decreased significantly. See the comparative example 5. In case where the value of y1 is more than 0.60, the polarization-disappearance temperature Td is decreased significantly. See the comparative example 6.

The value of x2 included in the mathematical formula (III) represents a sodium composition ratio in the piezoelectric layer 15. In case where the value of x2 is less than 0.30, the polarization-disappearance temperature Td is decreased significantly. See the comparative example 3. In case where the value of x2 is more than 0.46, the polarization-disappearance temperature Td is decreased significantly. See the comparative example 4.

The value of y2 included in the mathematical formula (IV) represents a bismuth composition ratio in the piezoelectric layer 15. In case where the value of y2 is less than 0.51, the polarization-disappearance temperature Td is decreased significantly. See the comparative example 7. In case where the value of y2 is more than 0.63, the polarization-disappearance temperature Td is decreased significantly. See the comparative example 8.

In the piezoelectric film according to the present embodiment, it is desirable that both of the following two mathematical formulae (V)-(VI) are satisfied.

$$1.05 \leq x2/x1 \quad \text{(V)}$$

$$y2/y1 \leq 1.05 \quad \text{(VI)}$$

It is desirable that the ratio of x2/x1 included in the numerical formula (V) is not less than 1.05. In a case where the ratio of x2/x1 is less than 1.05, the piezoelectric constant d31 and the linearity may be decreased. See the example 13. It is desirable that the ratio of x2/x1 is not more than 1.39.

It is desirable that the ratio of y2/y1 included in the numerical formula (VI) is not more than 1.05. In a case where the ratio of y2/y1 is more than 1.05, the piezoelectric constant d31 and the linearity may be decreased. See the example 14. It is desirable that the ratio of y2/y1 is not less than 0.93.

As is clear from Comparative of the examples with the comparative examples, if all of the four mathematical formulae (I)-(IV) are satisfied, the piezoelectric layer 15 has a polarization-disappearance temperature Td of not less than 300 degrees Celsius. One example of the upper limit of the polarization-disappearance temperature Td is 420 degrees Celsius.

As is clear from Comparative of the examples 1-12 with the examples 13-15, if all of the six mathematical formulae (I)-(VI) are satisfied, the piezoelectric layer 15 has a polarization-disappearance temperature Td of not less than 370 degrees Celsius.

If all of the six mathematical formulae (I)-(VI) are satisfied, the piezoelectric layer 15 has not only a high polarization-disappearance temperature Td but also a high piezoelectric constant d31. In more detail, such a piezoelectric layer 15 has piezoelectric constants d31 which satisfy the following mathematical formulae (VII)-(VIII).

$$|\text{Piezoelectric constant } d31 \text{ (0.3 volts/micrometer)}| \geq 71 \quad \text{(VII)}$$

$$|\text{Piezoelectric constant } d31 \text{ (1.8 volts/micrometer)}| \geq 74 \quad \text{(VIII)}$$

If all of the six mathematical formulae (I)-(VI) are satisfied, the piezoelectric layer 15 has a high linearity which satisfies the following formulae (IX).

$$0.94 \leq (\text{Piezoelectric constant } d31 \text{ (0.3 volts/micrometer)}/\text{Piezoelectric constant } d31 \text{ (1.8 volts/micrometer)}) \leq 1.00 \quad \text{(IX)}$$

The piezoelectric layer 15 according to the present embodiment may contain a minute amount of impurities. The impurities typically may be Li and K to substitute for Na, and Sr and Ca to substitute for Ba. The impurities typically may be Zr to substitute for Ti. Examples of the other impurities may be Mn, Co, Al, Ga, Nb, and Ta. Some of these impurities can improve the crystallinity and piezoelectric performance of the piezoelectric layer 15.

As shown in FIG. 1B, the piezoelectric film according to the present embodiment may comprise a metal electrode layer 12. The LaNiO$_3$ layer 13 is formed on the metal electrode layer 12.

An example of the material of the metal electrode layer 12 is metal such as platinum, palladium, or gold; a conductive oxide such as nickel oxide, ruthenium oxide, iridium oxide, or strontium ruthenate. The metal electrode layer 12 can be made of two or more these materials. Preferably, the metal electrode layer 12 has a low electrical resistance and a high heat resistance. Therefore, it is preferred that the metal electrode layer 12 is a platinum layer. The platinum layer may have a (111) orientation.

In other words, the piezoelectric film according to the present embodiment may further comprise a platinum layer. The LaNiO$_3$ layer 13 may be formed on the platinum layer.

The metal electrode layer 12 can serve as an electrode layer to apply a voltage to the piezoelectric layer 15 together with the LaNiO$_3$ layer 13. In other words, the electrode layer is a laminate composed of the LaNiO$_3$ layer 13 and the metal electrode layer 12.

As shown in FIG. 1B, the piezoelectric film according to the present embodiment may comprise a conductive layer 17. The conductive layer 17 is formed on the piezoelectric layer 15.

The piezoelectric layer 15 is interposed between the LaNiO$_3$ layer 13 and the conductive layer 17. The LaNiO$_3$ layer 13 and the conductive layer 17 can serve as a first electrode layer and a second electrode layer, respectively, to apply a voltage to the piezoelectric layer 15.

The conductive layer 17 is made of a conductive material. An example of the material is a metal having a low electrical resistance. The material may be a conductive oxide such as NiO, RuO$_2$, IrO$_3$, SrRuO$_3$, or LaNiO$_3$. The conductive layer 17 may be composed of two or more these materials. A metal layer may be provided between the conductive layer 17 and the piezoelectric layer 15 to improve the adhesion therebetween. An example of the material of the metal layer is titanium. The material may be tantalum, iron, cobalt, nickel, or chrome. The metal layer may be composed of two or more these materials. The metal layer may be omitted depending on the adhesion between the conductive layer 17 and the piezoelectric layer 15.

The conductive layer 17 can be formed by a thin film formation technique such as sputtering, PLD, CVD, a sol-gel technique, or AD.

The piezoelectric film according to the present embodiment may further comprise a substrate 11, as shown in FIG. 1B. The metal electrode layer 12 is formed on the substrate 11.

The substrate 11 may be a silicon substrate. A silicon monocrystalline substrate is desirable.

A metal layer may be disposed between the substrate 11 and the metal electrode layer 12 to improve the adhesion therebetween. However, the metal layer needs electric conductivity. An example of the material of the metal layer may be Ti, Ta, Fe, Co, Ni, or Cr. Ti is desirable. Two or more materials may be used for the metal layer. The metal layer can be omitted, depending on the adhesion between the substrate 11 and the metal electrode layer 12.

(Fabrication Method)

A method for fabricating the piezoelectric layer 15 according to the present embodiment will be described below.

First, the substrate 11 is prepared. The metal electrode layer 12 is formed by a sputtering technique on the substrate 11. Then, the LaNiO$_3$ layer 13 is formed by a sputtering technique on the metal electrode layer 12.

It is known that a LaNiO$_3$ layer has an intense (001) orientation regardless of the orientation of a layer which is in contact with and located below the LaNiO$_3$ layer. For this reason, the interface layer 14 formed on the LaNiTiO$_3$ layer 13 also has an intense (001) orientation. Since the interface layer 14 has an intense (001) orientation, the piezoelectric layer 15 also has an intense (001) orientation.

The interface layer 14 is formed on the LaNiO$_3$ layer 13 by an RF sputtering technique. Subsequently, the piezoelectric layer 15 is formed by an RF sputtering technique on the interface layer 14. Finally, the conductive layer 17 is formed by a vapor deposition technique on the piezoelectric layer 15.

Another method may be used instead of a sputtering technique. An example thereof is a pulse laser deposition technique (PLD), a chemical vapor deposition technique (CVD), a sol-gel technique, or an aerosol deposition technique.

EXAMPLES

The following present examples describe the present invention in more detail.

In the following examples 1-12 and the comparative examples 1-12, the compositions of sodium and bismuth contained in the interface layer 14 were varied by changing the composition of the target used for the sputtering. The compositions of sodium and bismuth contained in the piezoelectric layer 15 were also varied by changing the composition of the target used for the sputtering.

Example 1

In the example 1, the piezoelectric film shown in FIG. 1B was fabricated as below.

A platinum layer having a (111) orientation was formed on a surface of a silicon monocrystalline substrate having a (100) orientation by an RF magnetron sputtering technique. The platinum layer had a thickness of 100 nanometers. This platinum layer served as the metal electrode layer 12.

The condition of the sputtering of the platinum layer is described below.

Target: Metal platinum
Atmosphere: Argon gas
RF power: 15W
Substrate temperature: 300 degrees Celsius Before the platinum layer was formed, a titanium layer having a thickness of 2.5 nanometers was formed on the surface of the silicon monocrystalline substrate to improve the adhesion between the silicon monocrystalline substrate and the platinum layer. The titanium layer was formed under the sputtering condition similar to the sputtering condition for the platinum layer, except that metal titanium was used as a target instead of the metal platinum.

Next, the $LaNiO_3$ layer 13 having a (001) orientation only was formed on the surface of the platinum layer by an RF magnetron sputtering technique. The $LaNiO_3$ layer 13 had a thickness of 500 nanometers The condition of he sputtering for the $LaNiO_3$ layer 13 is described below.

Target: $LaNiO_3$
Atmosphere: Gaseous mixture of argon and oxygen (Flow ratio of $Ar/O_2$: 80/20)
RF power: 100W
Substrate temperature: 300 degrees Celsius Then, the interface layer 14 having a (001) orientation only was formed on the surface of the $LaNiO_3$ layer 13 by an RF sputtering technique. The interface layer 14 had a thickness of 0.3 micrometers. The formed interface layer 14 was subjected to an X-ray diffraction analysis to analyze the crystal structure thereof. The X-ray diffraction analysis was carried out in such a manner that an X-ray beam was made incident from above the interface layer 14.

Figure 2:
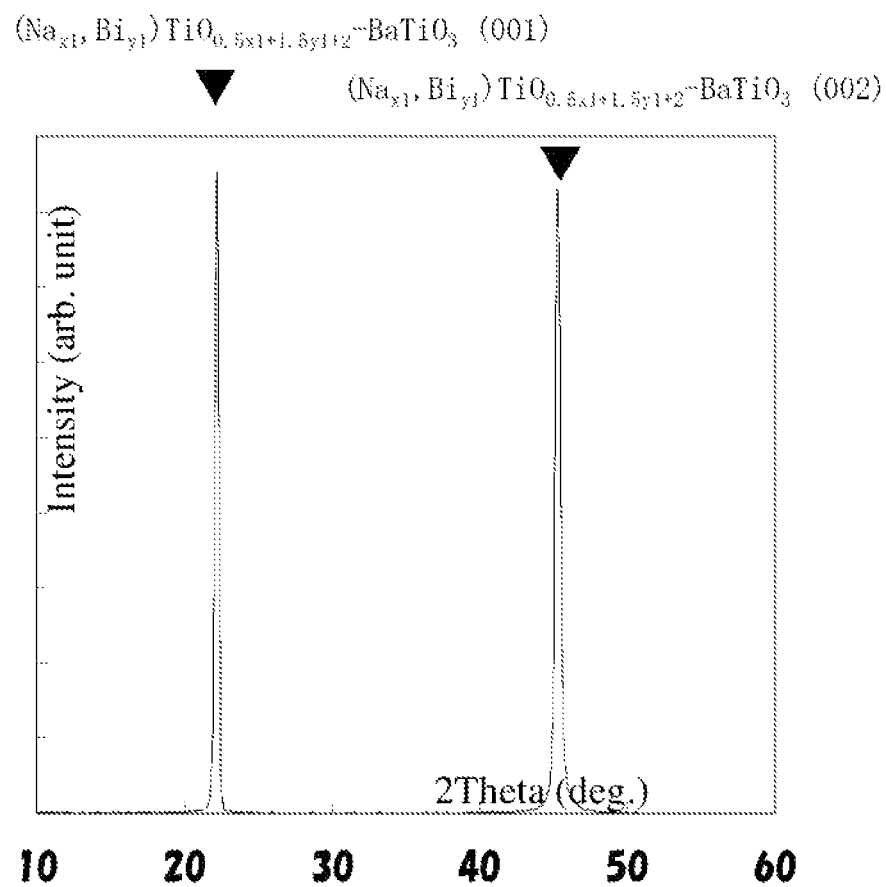
FIG. 2 shows the result of the X-ray diffraction analysis of the interface layer 14 in the example 1.

FIG. 2 shows the result of the X-ray diffraction analysis of the interface layer 14. Observed was only the reflection peak derived from the interface layer 14 having a (001) orientation only. In the following examples and comparative examples, X-ray diffraction analyses were carried out in the same manner. As a result, in the following examples and comparative examples, a significantly intense (001) orientation was observed for all the films by this X-ray diffraction analysis method.

The condition of the sputtering for the interface layer 14 is described below.

Target: $(Na_{x1}, Bi_{y1})TiO_{0.5x1+1.5y1+2}$-$BaTiO_3$ (x1=0.37, y1=0.58) containing nickel (the Ni/Ti molar ratio=0.02)

Atmosphere: Gaseous mixture of argon and oxygen (Flow ratio of $Ar/O_2$: 50/50)
RF power: 170W
Substrate temperature: 650 degrees Celsius Next, the piezoelectric layer 15 having a (001) orientation only was formed on the surface of the interface layer 14 by an RF magnetron sputtering technique. The piezoelectric layer 15 had a thickness of 2.7 micrometers. The formed piezoelectric layer 15 was subjected to an X-ray diffraction analysis to analyze the crystal structure thereof.

Figure 3:
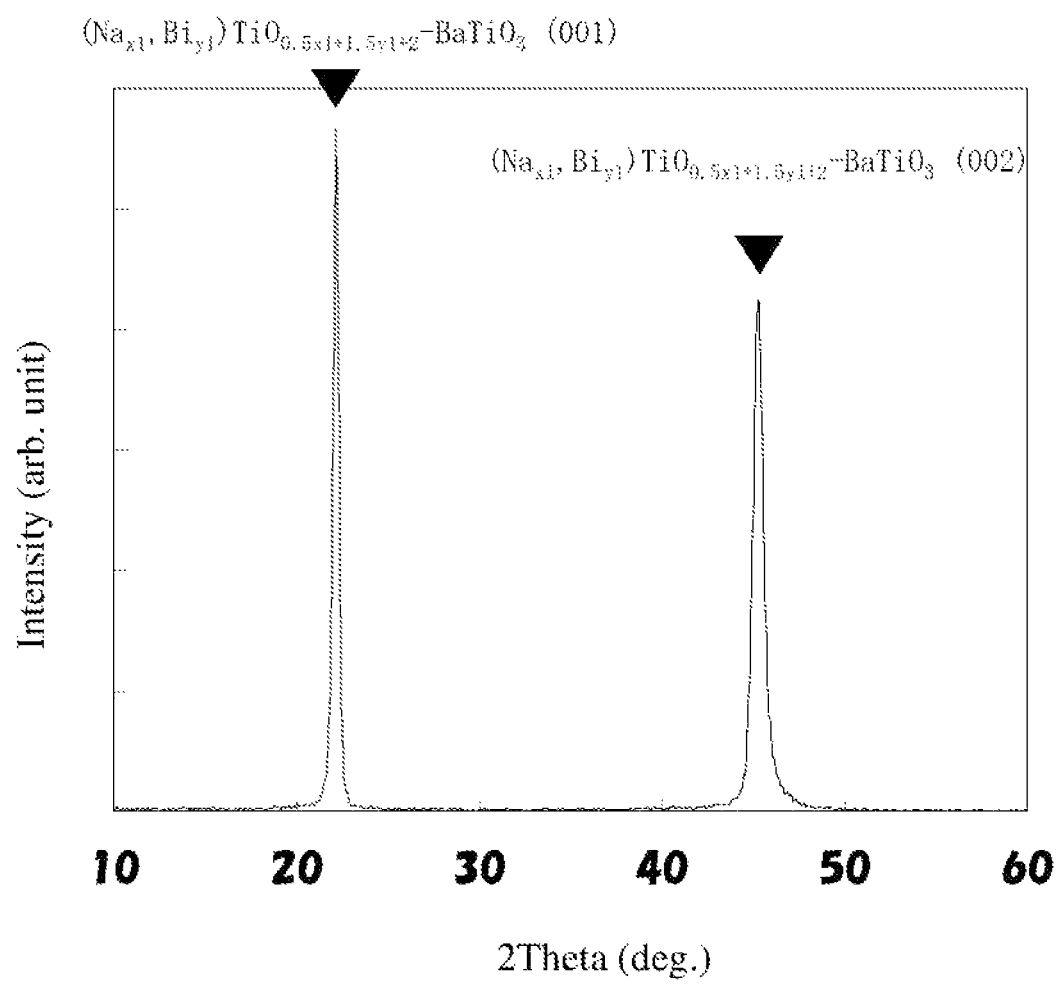
FIG. 3 shows the result of the X-ray diffraction analysis of the piezoelectric layer 15 in the example 1.

FIG. 3 shows the result of the X-ray diffraction analysis of the piezoelectric layer 15. Observed was only the reflection peak derived from the piezoelectric layer 15 having a (001) orientation only.

The condition of the sputtering for the piezoelectric layer 15 is described below.

Target: $(Na_{x2}, Bi_{y2})TiO_{0.5x2+1.5y2+2}$-$BaTiO_3$ (x2=0.39 and y2=0.55)
Atmosphere: Gaseous mixture of argon and oxygen (Flow ratio of $Ar/O_2$: 50/50)
RF power: 170W
650 degrees Celsius The compositions of the formed interface layer 14 and piezoelectric layer 15 were analyzed by an energy dispersive X-ray analysis method (SEM-EDX) and a wavelength dispersive X-ray micro analyzer (WDS). In the composition analysis, it was difficult to quantify a light element accurately, since the analysis accuracy of the light element such as oxygen was low. However, it was confirmed that the composition of sodium, bismuth and nickel contained in the formed interface layer 14 was identical to the composition of the target of the interface layer 14. It was confirmed that the composition of sodium and bismuth contained in the formed piezoelectric layer 15 was identical to the composition of the target of the piezoelectric layer 15.

Finally, a gold layer having a thickness of 100 nanometers was formed by a vapor deposition technique on the surface of the piezoelectric layer 15. The gold layer corresponds to the conductive layer 17. In this way, the piezoelectric film according to the example 1 was fabricated.

The polarization-disappearance temperature Td of the piezoelectric layer 15 was measured pursuant to the disclosure of Journal of the American Ceramic Society 93 [4] (2010) 1108-1113. As a result, the polarization-disappearance temperature Td of the piezoelectric layer 15 according to the example 1 was a high value of 420 degrees Celsius. This means that the piezoelectric performance of the piezoelectric layer 15 was maintained under a solder reflow temperature of 180 degrees Celsius.

The piezoelectric performance of the piezoelectric layer 15 was evaluated in the following manner. The piezoelectric layer 15 was cut into a strip with a width of 2 millimeters and worked into a cantilever shape. A potential difference was applied between the platinum layer and the gold layer to displace the cantilever by the electric field generated between the two layers, and the resulting displacement of the cantilever was measured with a laser displacement meter.

Then, the measured displacement amount was converted into the piezoelectric constant $d_{31}$. The piezoelectric constant $d_{31}$ (0.3 volts/micrometer) of the piezoelectric layer 15 according to the example 1 was −85 pm/V, when a low electric field of 0.3 volts/micrometer) was applied.

When a high electric field of 1.8 volts/micrometer was applied, the piezoelectric constant $d_{31}$ (1.8 volts/micrometer) of the piezoelectric layer 15 according to the example 1 was −85 pm/V.

The linearity of the piezoelectric layer 15 according to the example 1 was estimated on the basis of the ratio of the piezoelectric constant d31 (0.3 volts/micrometer) to the piezoelectric constant $d_{31}$ (1.8 volts/micrometer). In the example 1, this ratio was 1.00. This means that the amount of the displacement was completely proportional to the applied electric field.

Example 2

A piezoelectric film was fabricated similarly to the one according to the example 1, except that x1=0.28, y1=0.51, x2=0.33, and y2=0.52.

Example 3

A piezoelectric film was fabricated similarly to the one according to the example 1, except that x1=0.43, y1=0.56, x2=0.46, and y2=0.55.

Example 4

A piezoelectric film was fabricated similarly to the one according to the example 1, except that x1=0.28, y1=0.60, x2=0.30, and y2=0.59.

Example 5

A piezoelectric film was fabricated similarly to the one according to the example 1, except that x1=0.33, y1=0.52, x2=0.46, and y2=0.52.

Example 6

A piezoelectric film was fabricated similarly to the one according to the example 1, except that x1=0.35, y1=0.49, x2=0.40, and y2=0.51.

Example 7

A piezoelectric film was fabricated similarly to the one according to the example 1, except that x1=0.38, y1=0.60, x2=0.41, and y2=0.61.

Example 8

A piezoelectric film was fabricated similarly to the one according to the example 1, except that x1=0.40, y1=0.59, x2=0.44, and y2=0.63.

Example 9

A piezoelectric film was fabricated similarly to the one according to the example 1, except that x1=0.35, y1=0.55, x2=0.41, and y2=0.51.

Example 10

A piezoelectric film was fabricated similarly to the one according to the example 1, except that x1=0.40, y1=0.50, x2=0.42, and y2=0.52.

Example 11

A piezoelectric film was fabricated similarly to the one according to the example 1, except that x1=0.41, y1=0.60, x2=0.44, and y2=0.63.

Example 12

A piezoelectric film was fabricated similarly to the one according to the example 1, except that x1=0.37, y1=0.58, x2=0.39, and y2=0.55.

Example 13

A piezoelectric film was fabricated similarly to the one according to the example 1, except that x1=0.42, y1=0.53, x2=0.40, and y2=0.55.

Example 14

A piezoelectric film was fabricated similarly to the one according to the example 1, except that x1=0.35, y1=0.59, x2=0.37, and y2=0.63.

Example 15

A piezoelectric film was fabricated similarly to the one according to the example 1, except that the Ni/Ti molar ratio was equal to 0.07.

Comparative Example 1

A piezoelectric film was fabricated similarly to the one according to the example 1, except that x1=0.25, y1=0.55, x2=0.40, and y2=0.52.

Comparative Example 2

A piezoelectric film was fabricated similarly to the one according to the example 1, except that x1=0.45, y1=0.58, x2=0.46 and y2=0.55.

Comparative Example 3

A piezoelectric film was fabricated similarly to the one according to the example 1, except that x1=0.30, y1=0.59, x2=0.28 and y2=0.55.

Comparative Example 4

A piezoelectric film was fabricated similarly to the one according to the example 1, except that x1=0.32, y1=0.60, x2=0.47, and y2=0.56.

Comparative Example 5

A piezoelectric film was fabricated similarly to the one according to the example 1, except that x1=0.33, y1=0.45, x2=0.35, and y2=0.52.

Comparative Example 6

A piezoelectric film was fabricated similarly to the one according to the example 1, except that x1=0.30, y1=0.63, x2=0.33, and y2=0.55.

Comparative Example 7

A piezoelectric film was fabricated similarly to the one according to the example 1, except that x1-0.31, y1=0.51, x2=0.34, and y2=0.48.

Comparative Example 8

A piezoelectric film was fabricated similarly to the one according to the example 1, except that x1=0.32, y1=0.60, x2=0.37, and y2=0.65.

Comparative Example 9

A piezoelectric film was fabricated similarly to the one according to the example 1, except that the Ni/Ti molar ratio was equal to 0.01.

The following Table 1 and Table 2 show the results of the examples and the comparative examples.

TABLE 1

| | x1 | y1 | Ni/Ti molar ratio | x2 | y2 | x2/x1 | y2/y1 |
|---|---|---|---|---|---|---|---|
| Example 1 | 0.37 | 0.58 | 0.02 | 0.39 | 0.55 | 1.05 | 0.95 |
| Example 2 | 0.28 | 0.51 | 0.02 | 0.33 | 0.52 | 1.18 | 1.02 |
| Comparative example 1 | 0.25 | 0.55 | 0.02 | 0.40 | 0.52 | 1.60 | 0.95 |
| Comparative example 2 | 0.45 | 0.58 | 0.02 | 0.46 | 0.55 | 1.02 | 0.95 |
| Example 3 | 0.43 | 0.56 | 0.02 | 0.46 | 0.55 | 1.07 | 0.98 |
| Example 4 | 0.28 | 0.60 | 0.02 | 0.30 | 0.59 | 1.07 | 0.98 |
| Comparative example 3 | 0.30 | 0.59 | 0.02 | 0.28 | 0.55 | 0.93 | 0.93 |
| Comparative example 4 | 0.32 | 0.60 | 0.02 | 0.47 | 0.56 | 1.47 | 0.93 |
| Example 5 | 0.33 | 0.52 | 0.02 | 0.46 | 0.52 | 1.39 | 1.00 |
| Example 6 | 0.35 | 0.49 | 0.02 | 0.40 | 0.51 | 1.14 | 1.04 |
| Comparative example 5 | 0.33 | 0.45 | 0.02 | 0.35 | 0.52 | 1.06 | 1.16 |
| Comparative example 6 | 0.30 | 0.63 | 0.02 | 0.33 | 0.55 | 1.10 | 0.87 |
| Example 7 | 0.38 | 0.60 | 0.02 | 0.41 | 0.61 | 1.08 | 1.02 |
| Example 8 | 0.40 | 0.59 | 0.02 | 0.44 | 0.63 | 1.10 | 1.07 |
| Comparative example 7 | 0.31 | 0.51 | 0.02 | 0.34 | 0.48 | 1.10 | 0.94 |
| Comparative example 8 | 0.32 | 0.60 | 0.02 | 0.37 | 0.65 | 1.16 | 1.08 |
| Example 9 | 0.35 | 0.55 | 0.02 | 0.41 | 0.51 | 1.17 | 0.93 |
| Example 10 | 0.40 | 0.50 | 0.02 | 0.42 | 0.52 | 1.05 | 1.04 |
| Example 13 | 0.42 | 0.53 | 0.02 | 0.40 | 0.55 | 0.95 | 1.04 |
| Example 11 | 0.41 | 0.60 | 0.02 | 0.44 | 0.63 | 1.07 | 1.05 |
| Example 14 | 0.35 | 0.59 | 0.02 | 0.37 | 0.63 | 1.06 | 1.07 |
| Comparative example 9 | 0.37 | 0.58 | 0.01 | 0.39 | 0.55 | 1.05 | 0.95 |
| Example 12 | 0.37 | 0.58 | 0.05 | 0.39 | 0.55 | 1.05 | 0.95 |
| Example 15 | 0.37 | 0.58 | 0.07 | 0.39 | 0.55 | 105 | 0.95 |

TABLE 2

| | Piezoelectric constant d31 @ 0.3 V/ micrometer (pm/V) | Piezoelectric constant d31 @ 1.8 V/ micrometer (pm/V) | Linearity (d31 @ 0.3 V/ d31 @ 1.8 V) | Td (degrees Celsius) |
|---|---|---|---|---|
| Example 1 | −85 | −85 | 1 | 420 |
| Example 2 | −75 | −79 | 0.95 | 400 |
| Comparative example 1 | −33 | −44 | 0.75 | 174 |
| Comparative example 2 | −31 | −39 | 0.8 | 163 |
| Example 3 | −77 | −80 | 0.96 | 413 |
| Example 4 | −75 | −78 | 0.96 | 370 |
| Comparative example 3 | −37 | −46 | 0.81 | 169 |
| Comparative example 4 | −36 | −48 | 0.75 | 173 |
| Example 5 | −74 | −78 | 0.95 | 384 |
| Example 6 | −79 | −81 | 0.97 | 380 |
| Comparative example 5 | −41 | −51 | 0.8 | 150 |
| Comparative example 6 | −39 | −49 | 0.79 | 155 |
| Example 7 | −71 | −74 | 0.96 | 412 |
| Example 8 | −73 | −75 | 0.97 | 370 |
| Comparative example 7 | −39 | −46 | 0.85 | 160 |
| Comparative example 8 | −36 | −44 | 0.81 | 171 |
| Example 9 | −78 | −82 | 0.95 | 380 |
| Example 10 | −75 | −80 | 0.94 | 389 |
| Example 13 | −71 | −87 | 0.82 | 303 |
| Example 11 | −73 | −77 | 0.95 | 392 |
| Example 14 | −73 | −91 | 0.8 | 310 |
| Comparative example 9 | −72 | −78 | 0.92 | 177 |
| Example 12 | −81 | −81 | 1 | 402 |
| Example 15 | −58 | −69 | 0.84 | 335 |

As is clear from Table 1 and Table 2, if all of the four mathematical formulae (I)-(IV) are satisfied, the piezoelectric film 15 has a significantly high polarization-disappearance temperature Td of not less than 300 degrees Celsius. In other words, even when the piezoelectric film 15 is heated under a temperature less than 300 degrees Celsius, the polarization of the piezoelectric film 15 does not disappear. If all of the six mathematical formulae (I)-(VI) are satisfied, the piezoelectric film 15 has significantly high polarization-disappearance temperature Td of not less than 370 degrees Celsius. Furthermore, such a piezoelectric film 15 has a high piezoelectric constant d31 and a high linearity.

As is clear from the comparative example 1, in case where x1 is less than 0.28, the polarization-disappearance temperature Td is significantly low.

As is clear from the comparative example 2, in case where x1 is more than 0.43, the polarization-disappearance temperature Td is significantly low.

As is clear from the comparative example 3, in case where x2 is less than 0.30, the polarization-disappearance temperature Td is significantly low.

As is clear from the comparative example 4, in case where x2 is more than 0.47, the polarization-disappearance temperature Td is significantly low.

As is clear from the comparative example 5, in case where y1 is less than 0.49, the polarization-disappearance temperature Td is significantly low.

As is clear from the comparative example 6, in case where y1 is more than 0.60, the polarization-disappearance temperature Td is significantly low.

As is clear from the comparative example 7, in case where y2 is less than 0.51, the polarization-disappearance temperature Td is significantly low.

As is clear from the comparative example 8, in case where y2 is more than 0.63, the polarization-disappearance temperature Td is significantly low.

As is clear from the example 13, in a case where the ratio of x2/x1 is less than 1.05, the piezoelectric constant d31 and the linearity is low.

As is clear from the example 14, in a case where the ratio of y2/y1 is more than 1.05, the piezoelectric constant d31 and the linearity is low.

As is clear from the comparative example 9, in case where the Ni/Ti molar ratio is less than 0.02, the polarization-disappearance temperature Td is significantly low.

As is clear from the example 15, in a case where the Ni/Ti molar ratio is more than 0.05, the piezoelectric constant d31 and the linearity are low.

INDUSTRIAL APPLICABILITY

The piezoelectric film according to the present invention can be used for an ink-jet head, an angular velocity sensor, and a piezoelectric generating element.

The ink jet head, the angular velocity sensor, and the piezoelectric power generation element each comprising the above-mentioned piezoelectric film are described. For more detail, see International publication No. 2010/047049. U.S. Pat. No. 7,870,787 and Chinese Laid-open patent application publication No. 101981718 are the United States patent publication and the Chinese laid-open patent application publication which correspond to International publication No. 2010/047049, respectively.

[Ink Jet Head]

An ink jet head of the present invention will be described below with reference to FIG. 5 to FIG. 7.

Figure 5:
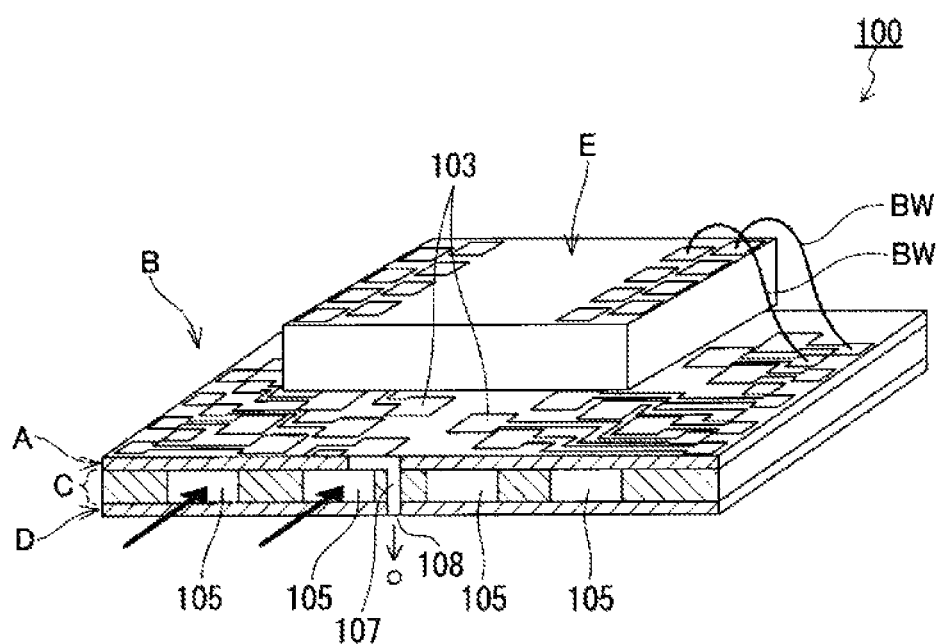
FIG. 5 is a perspective view schematically showing an example of an ink jet head of the present invention and partially showing a cross section of the ink jet head.

FIG. 5 shows one embodiment of the ink jet head of the present invention. FIG. 6 is an exploded view showing main parts including a pressure chamber member and an actuator part in an ink jet head 100 shown in FIG. 5.

Figure 6:
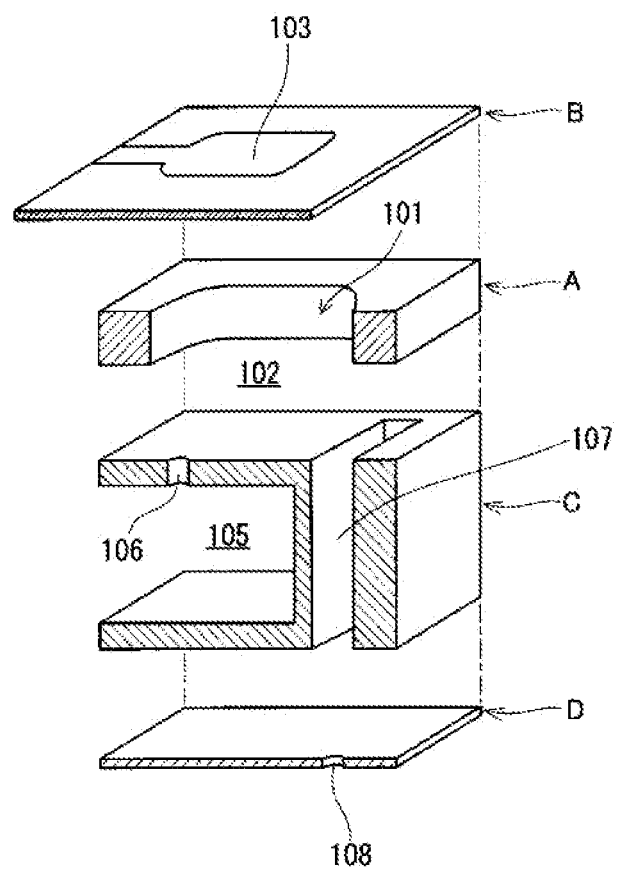
FIG. 6 is an exploded perspective view schematically showing main parts including a pressure chamber member and an actuator part in the ink jet head shown in FIG. 5 and partially showing a cross section of the main parts.

A reference character A in FIG. 5 and FIG. 6 indicates a pressure chamber member. The pressure chamber member A includes through-holes 101 that penetrate therethrough in its thickness direction (in the upward and downward directions in these diagrams). The through-hole 101 shown in FIG. 6 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 5 and FIG. 6, a reference numeral 103 indicates an individual electrode layer that is a part of the piezoelectric film. As shown in FIG. 5, in the ink jet head 100, a plurality of individual electrode layers 103, that is, piezoelectric films are arranged in a zigzag pattern in plan view.

The ink passage member C has the common liquid chambers 105 arranged in stripes in plan view. In FIG. 5 and FIG. 6, each of the common liquid chambers 105 is aligned over a plurality of pressure chambers 102 in plan view. The common liquid chambers 105 extend in the ink supply direction (in the direction indicated by arrows in FIG. 5) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 5, a reference character E indicates an IC chip. The IC chip E is connected electrically to the individual electrode layers 103, which are exposed on the surface of the actuator part B, through bonding wires BW. For simplicity of FIG. 5, only a part of the bonding wires BW are shown in FIG. 5.

FIG. 6 shows the configuration of the main parts including the pressure chamber member A and the actuator part B. FIG. 7 shows the cross section perpendicular to the ink supply direction (in the direction indicated by the arrows in FIG. 5) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 7:
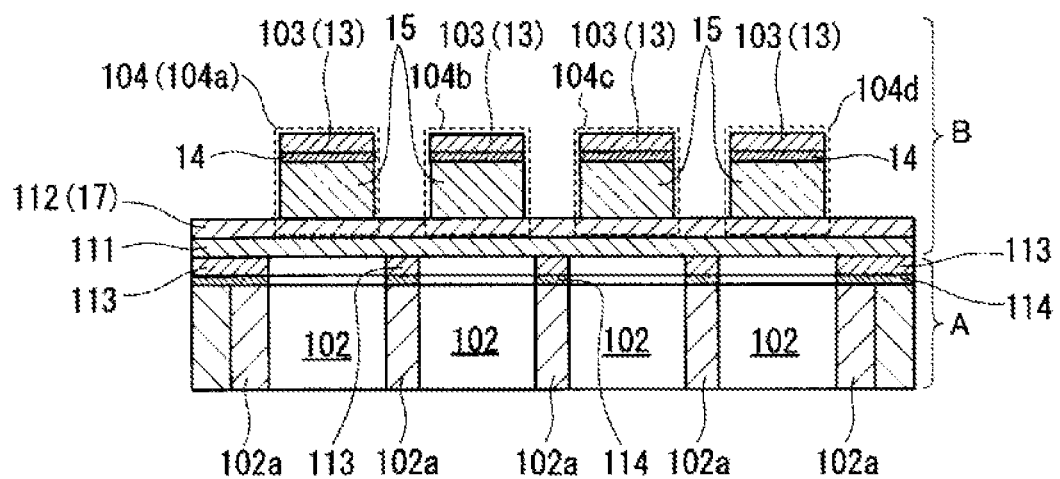
FIG. 7 is a cross-sectional view schematically showing an example of the main parts including the pressure chamber member and the actuator part in the ink jet head shown in FIG. 5.

As surrounded by the dashed-line in FIG. 7, the above-mentioned piezoelectric films 104 are arranged in the ink jet head. The piezoelectric film is the piezoelectric film described in the item titled as "Piezoelectric film".

[Image Forming Method by Ink Jet Head]

The image forming method for the present invention includes, in the above-described ink jet head of the present invention, a step of applying a voltage to the piezoelectric layer through the first and second electrodes (that is the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

[Angular Velocity Sensor]

Figure 8:
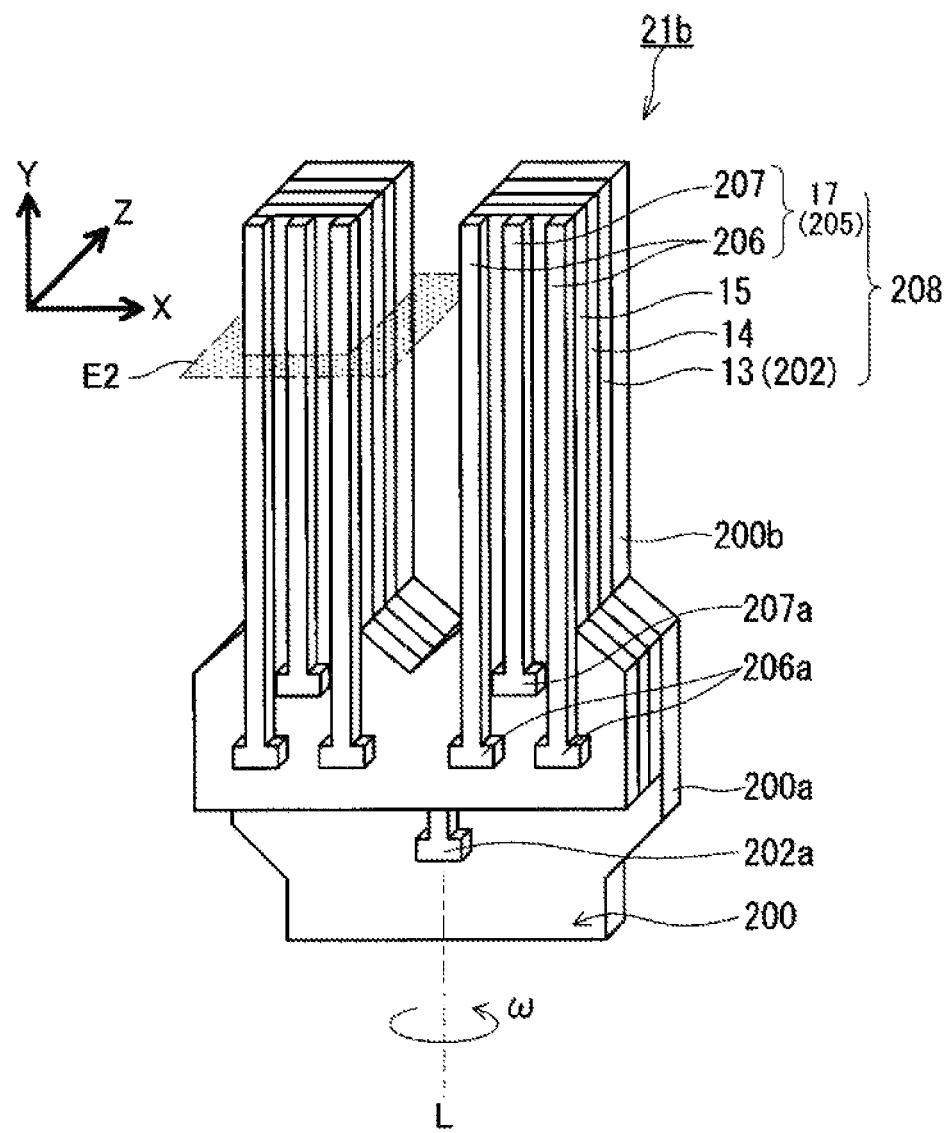
FIG. 8 is a perspective view schematically showing an example of an angular velocity sensor of the present invention.
Figure 9:
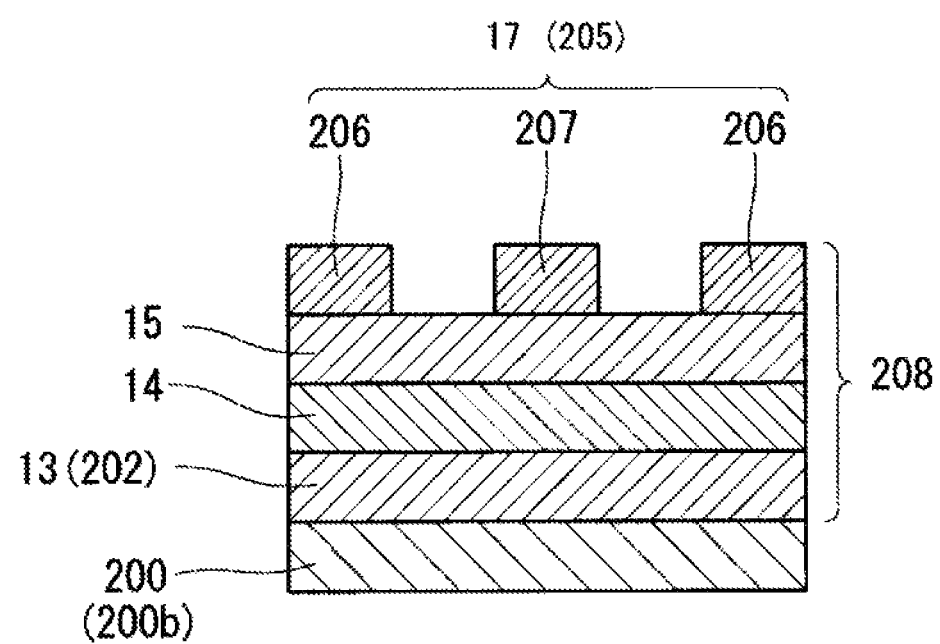
FIG. 9 is a cross-sectional view showing a cross section E1 of the angular velocity sensor shown in FIG. 8.

FIG. 8 shows examples of an angular velocity sensor of the present invention. FIG. 9 shows a cross section E1 of an angular velocity sensor 21a shown in FIG. 8. The angular velocity sensor 21a shown in FIG. 8 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 8 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 7. The substrate 200 has a shape of a tuning fork including two arms (vibration parts 200b), when viewed from the thickness direction of the substrate 200 (the Z direction in FIG. 7).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop.

More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric layer described in the item titled as "Piezoelectric film". As shown in FIG. 8 and FIG. 9, the piezoelectric film 208 comprises the first electrode 13 (202), the interface layer 14, the piezoelectric layer 15, and the second electric layer 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 8). More particularly, in the angular velocity sensor shown in FIG. 8, a pair of drive electrodes 206 are provided on both of the width-direction edge portions of the vibration part 200b along the length direction thereof (the Y direction in FIG. 8). Only one drive electrode 206 may be provided on one of the width direction edge portions of the vibration part 200b. In the angular velocity sensor shown in FIG. 8, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 8).

In the angular velocity sensor of the present invention, one of the first electrode and the second electrode selected therefrom can be composed of an electrode group including the drive electrode and the sense electrode. In the angular velocity sensor 21a shown in FIG. 8, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 8, the connection terminals are provided on the stationary part 200a.

In the angular velocity sensor shown in FIG. 8, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 8 has one vibration part group consisting of a pair of vibration parts 200b.

[Method for Measuring Angular Velocity By Angular Velocity Sensor]

The angular velocity measuring method for the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 8 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 8). In the angular velocity sensors 21a shown in FIG. 8, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the opposite direction mode, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and an angular velocity ω is true:

$$Fc = 2mv\omega$$

where v is the velocity of the oscillating vibration part 200b in the oscillation direction, and m is the mass of the vibration part 200b. As shown in this equation, the angular velocity ω can be calculated from the Coriolis force Fc.

[Piezoelectric Generating Element]

Figure 10:
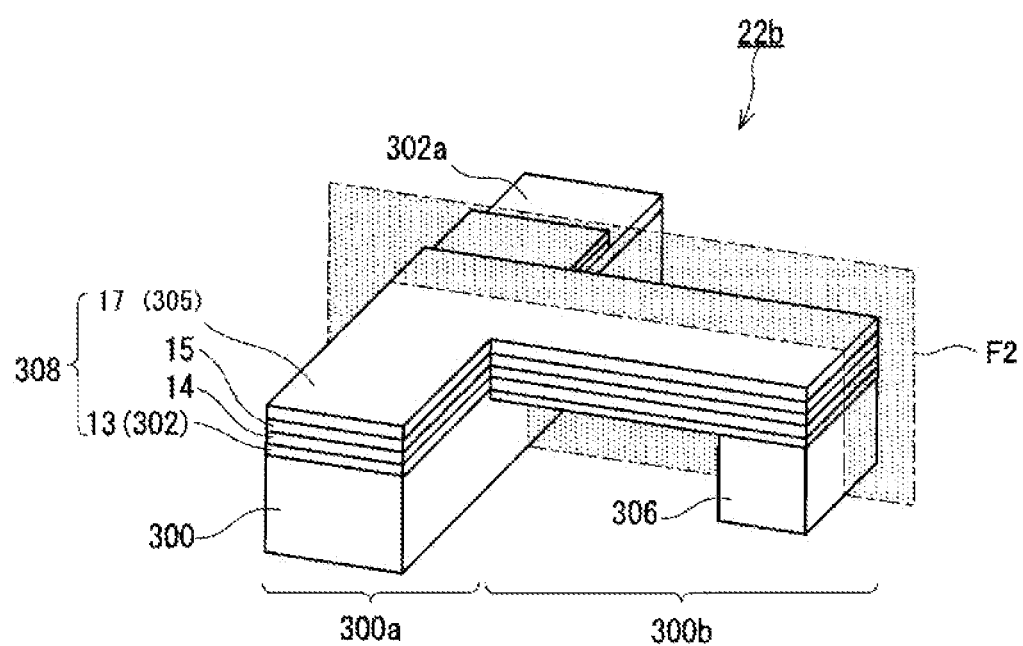
FIG. 10 is a perspective view schematically showing an example of a piezoelectric generating element of the present invention.
Figure 11:
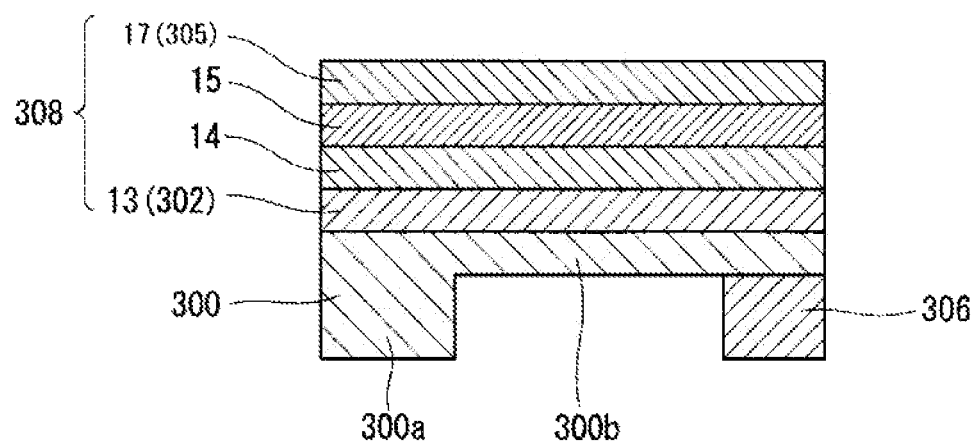
FIG. 11 is a cross-sectional view showing a cross section F1 of the piezoelectric generating element shown in FIG. 10.

FIG. 10 shows an example of the piezoelectric generating element of the present invention. FIG. 11 shows a cross section F1 of a piezoelectric generating element 22a shown in FIG. 10. The piezoelectric generating elements 22a are elements that convert externally-applied mechanical vibration into electrical energy. The piezoelectric generating elements 22*a* are applied suitably to a self-sustained power supply for generating electric power from various vibrations including engine vibrations and driving vibrations generated in vehicles and machines, and vibrations generated during walking.

The piezoelectric generating element 22*a* shown in FIG. 10 includes a substrate 300 having a vibration part 300*b* and a piezoelectric film 308 bonded to the vibration part 300*b*.

The substrate 300 has a stationary part 300*a*, and a vibration part 300*b* having a beam extending in a predetermined direction from the stationary part 300*a*. The material of the stationary part 300*a* can be the same as the material of the vibration part 300*b*. These materials may, however, be different from each other. The stationary part 300*a* and the vibration part 300*b* made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300*a* may have a thickness different from that of the vibration part 300*b*. The thickness of the vibration part 300*b* can be adjusted for efficient power generation by changing the resonance frequency of the vibration part 300*b*.

A weight load 306 is bonded to the vibration part 300*b*. The weight load 306 adjusts the resonance frequency of the vibration part 300*b*. The weight load 306 is, for example, a vapor-deposited thin film of Ni. The material, shape, and mass of the weight load 306, as well as the position to which the weight load 306 is bonded can be adjusted according to a desired resonance frequency of the vibration part 300*b*. The weight load 306 may be omitted. The weight load 306 is not necessary when the resonance frequency of the vibration part 300*b* is not adjusted.

The piezoelectric film 308 is bonded to the vibration part 300*b*. The piezoelectric film 308 is the piezoelectric layer described in the item titled as "Piezoelectric film". As shown in FIG. 10 and FIG. 11, the piezoelectric film 308 comprises the first electrode 13 (302), the interface layer 14, the piezoelectric layer 15, the second electrode 17 (305).

In the piezoelectric generating elements shown in FIG. 10, a part of the first electrode 302 is exposed. This part can serve as a connection terminal 302*a*.

In the piezoelectric generating element shown in FIG. 10, the piezoelectric film 308 can be bonded to both of the vibration part 300*b* and the stationary part 300*a*. The piezoelectric film 308 can be bonded only to the vibration part 300*b*.

When the piezoelectric generating element of the present invention has a plurality of vibration parts 300*b*, an increased amount of electric power can be generated. Such a piezoelectric generating element can be applied to mechanical vibrations containing a wide range of frequency components if the plurality of vibration parts 300*b* have different resonance frequencies.

[Method for Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22*a*, the vibration part 300*b* starts vibrating to produce vertical deflection with respect to the stationary part 300*a*. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300*b* is close to the frequency of mechanical vibration to be applied externally to the element, the amplitude of the vibration part 300*b* increases and thus the electric power generation characteristics are improved. Therefore, the weight load 306 is preferably used to adjust the resonance frequency of the vibration part 300*b* to be close to the frequency of mechanical vibration applied externally to the element.

REFERENTIAL SIGNS LIST

11: substrate
12: metal electrode layer
13: $LaNiO_3$ layer (first electrode)
14: $(Na_{x1}, Bi_{y1})TiO_{0.5x1+1.5y1+2}$-$BaTiO_3$ interface layer
15: $(Na_{x2}, Bi_{y2})TiO_{0.5x2+1.5y2+2}$-$BaTiO_3$ piezoelectric layer
17: conductive layer (second electrode)

The invention claimed is:

1. A piezoelectric film comprising:
   a $(Na_{x1}, Bi_{y1})TiO_{0.5x1+1.5y1+2}$-$BaTiO_3$ layer having a (001) orientation only; and
   a $(Na_{x2}, Bi_{y2})TiO_{0.5x2+1.5y2+2}$-$BaTiO_3$ layer having a (001) orientation only, wherein
   the $(Na_{x2}, Bi_{y2})TiO_{0.5x2+1.5y2+2}$-$BaTiO_3$ layer is formed on the $(Na_{x1}, Bi_{y1})TiO_{0.5x1+1.5y1+2}$-$BaTiO_3$ layer;
   the $(Na_{x1}, Bi_{y1})TiO_{0.5x1+1.5y1+2}$-$BaTiO_3$ layer contains nickel;
   the $(Na_{x1}, Bi_{y1})TiO_{0.5x1+1.5y1+2}$-$BaTiO_3$ layer has a Ni/Ti molar ratio of not less than 0.02; and
   all of the following four mathematical formulae (I)-(IV) are satisfied $$0.28 \leq x1 \leq 0.43 \quad \text{(I)}$$

$$0.49 \leq y1 \leq 0.60 \quad \text{(II)}$$

$$0.30 \leq x2 \leq 0.46 \quad \text{(III)}$$

$$0.51 \leq y2 \leq 0.63 \quad \text{(IV)}.$$

2. The piezoelectric film according to claim 1, wherein the $(Na_{x2}, Bi_{y2})TiO_{0.5x2+1.5y2+2}$-$BaTiO_3$ layer is in contact with the $(Na_{x1}, Bi_{y1})TiO_{0.5x1+1.5y1+2}$-$BaTiO_3$ layer.

3. The piezoelectric film according to claim 1, wherein the $(Na_{x2}, Bi_{y2})TiO_{0.5x2+1.5y2+2}$-$BaTiO_3$ layer has a polarization-disappearance temperature Td of not less than 300 degrees Celsius.

4. The piezoelectric film according to claim 1, wherein the $(Na_{x2}, Bi_{y2})TiO_{0.5x2+1.5y2+2}$-$BaTiO_3$ layer has a polarization-disappearance temperature Td of not more than 420 degrees Celsius.

5. The piezoelectric film according to claim 1, wherein the Ni/Ti molar ratio is not more than 0.05; and
   both of the following two mathematical formulae (V)-(VI) are further satisfied $$1.05 \leq x2/x1 \quad \text{(V)}$$

$$y2/y1 \leq 1.05 \quad \text{(VI)}.$$

6. The piezoelectric film according to claim 5, wherein the $(Na_{x2}, Bi_{y2})TiO_{0.5x2+1.5y2+2}$-$BaTiO_3$ layer has a linearity which satisfies the following mathematical formula (IX);

$$0.94 \leq (\text{Piezoelectric constant } d31 \text{ (0.3 volts/micrometer)/Piezoelectric constant } d31 \text{ (1.8 volts/micrometer)}) \leq 1.00 \quad \text{(IX)}.$$

7. The piezoelectric film according to claim 6, wherein the $(Na_{x2}, Bi_{y2})TiO_{0.5x2+1.5y2+2}$-$BaTiO_3$ layer has values of the piezoelectric constants d31 which satisfy the following mathematical formulae (VII)-(VIII),

|Piezoelectric constant $d31$ (0.3 volts/micrometer)|≥71  (VII), and

|Piezoelectric constant $d31$ (1.8 volts/micrometer)|≥74  (VIII), and
the $(Na_{x2}, Bi_{y2})TiO_{0.5x2+1.5y2+2}$-$BaTiO_3$ layer has a polarization-disappearance temperature Td of not less than 370 degrees Celsius.

8. The piezoelectric film according to claim 1, wherein the $(Na_{x2}, Bi_{y2})TiO_{0.5x2+1.5y2+2}$-$BaTiO_3$ layer contains manganese.

9. The piezoelectric film according to claim 1, further comprising a $LaNiO_3$ layer, wherein
the $(Na_{x1}, Bi_{y1})TiO_{0.5x1+1.5y1+2}$-$BaTiO_3$ layer is interposed between the $LaNiO_3$ layer and the $(Na_{x2}, Bi_{t2})TiO_{0.5x2+1.5y2+2}$-$BaTiO_3$ layer.

10. An ink jet head comprising:
a piezoelectric film sandwiched between a first electrode and a second electrode;
a vibration layer bonded to the piezoelectric film; and
a pressure chamber member having a pressure chamber for storing an ink and bonded to a surface of the vibration layer opposite to a surface to which the piezoelectric film is bonded, wherein
the vibration layer is bonded to the piezoelectric film so that the vibration layer is displaceable in its film thickness direction according to a displacement of the piezoelectric film based on a piezoelectric effect;
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber; and
the piezoelectric film is the piezoelectric film according to claim 1.

11. A method for forming an image using an ink jet head, the method comprising:
a step (a) of preparing the ink jet head, wherein
the ink jet head comprises: a piezoelectric film sandwiched between a first electrode and a second electrode; a vibration layer bonded to the piezoelectric film; and a pressure chamber member having a pressure chamber for storing an ink and bonded to a surface of the vibration layer opposite to a surface to which the piezoelectric film is bonded,
the vibration layer is bonded to the piezoelectric film so that the vibration layer is displaceable in its film thickness direction according to a displacement of the piezoelectric film based on a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, and
the piezoelectric film is the piezoelectric film according to claim 1; and a step (b) of applying a voltage to the piezoelectric layer through the first electrode and the second electrode to displace, based on the piezoelectric effect, the vibration layer in its film thickness direction so that the volumetric capacity of the pressure chamber changes and eject the ink from the pressure chamber by the displacement.

12. An angular velocity sensor comprising:
a substrate having a vibration part; and
a piezoelectric film bonded to the vibration part and sandwiched between a first electrode and a second electrode, wherein
the piezoelectric film is the piezoelectric film according to claim 1; and
one of the first electrode and the second electrode selected therefrom is composed of an electrode group including a drive electrode for applying a driving voltage that oscillates the vibration part to the piezoelectric layer and a sense electrode for measuring a displacement of the vibration part caused by an angular velocity applied to the oscillating vibration part.

13. A method for measuring an angular velocity using an angular velocity sensor, the method comprising:
a step (a) of preparing the angular velocity sensor, wherein
the angular velocity sensor comprises: a substrate having a vibration part; and a piezoelectric film bonded to the vibration part and sandwiched between a first electrode and a second electrode,
the piezoelectric film is the piezoelectric film according to claim 1, and
one of the first electrode and the second electrode selected therefrom is composed of an electrode group including a drive electrode and a sense electrode;
a step (b) of applying a driving voltage to the piezoelectric layer through the drive electrode and the other of the first electrode and the second electrode selected therefrom to oscillate the vibration part; and
a step (c) of measuring, through the other electrode and the sense electrode, a displacement of the vibration part caused by an angular velocity applied to the oscillating vibration part to obtain a value of the applied angular velocity.

14. A piezoelectric generating element comprising:
a substrate having a vibration part; and
a piezoelectric film bonded to the vibration part and sandwiched between a first electrode and a second electrode, wherein
the piezoelectric film is the piezoelectric film according to claim 1.

15. A method for generating an electric power using a piezoelectric generating element, the method comprising:
a step (a) of preparing the piezoelectric generating element, wherein
the piezoelectric generating element comprises: a substrate having a vibration part; and a piezoelectric film bonded to the vibration part and sandwiched between a first electrode and a second electrode, and
the piezoelectric film is the piezoelectric film according to claim 1, and
a step (b) of vibrating the vibration part to obtain an electric power through the first electrode and the second electrode.

* * * * *